United States Patent
Lee

(10) Patent No.: US 8,680,638 B2
(45) Date of Patent: Mar. 25, 2014

(54) STACK-TYPE IMAGE SENSOR

(75) Inventor: Jung-hyun Lee, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 212 days.

(21) Appl. No.: 12/923,273

(22) Filed: Sep. 13, 2010

(65) Prior Publication Data

US 2011/0204461 A1 Aug. 25, 2011

(30) Foreign Application Priority Data

Feb. 24, 2010 (KR) .................. 10-2010-0016668

(51) Int. Cl.
*H01L 31/0232* (2006.01)

(52) U.S. Cl.
USPC ................. 257/440; 257/432; 257/E31.127; 438/65

(58) Field of Classification Search
USPC ................. 257/432, 440, E31.113, E31.127; 438/65, 67
See application file for complete search history.

(56) References Cited

U.S. PATENT DOCUMENTS

| | | | |
|---|---|---|---|
| 5,720,826 A * | 2/1998 | Hayashi et al. ............ | 136/249 |
| 6,188,092 B1 | 2/2001 | Hatano et al. | |
| 6,777,660 B1 * | 8/2004 | Lee ............ | 250/208.1 |
| 7,411,232 B2 * | 8/2008 | Ueda et al. .............. | 257/291 |
| 7,550,813 B2 * | 6/2009 | Suzuki ............. | 257/440 |
| 7,932,574 B2 * | 4/2011 | Kanbe .............. | 257/431 |
| 8,013,412 B2 * | 9/2011 | Tian .............. | 257/440 |
| 8,476,727 B2 * | 7/2013 | Tian et al. ............ | 257/444 |
| 8,482,093 B2 * | 7/2013 | Tian et al. ............ | 257/444 |
| 2004/0178463 A1 * | 9/2004 | Merrill et al. ............ | 257/440 |
| 2005/0087829 A1 * | 4/2005 | Merrill et al. ............ | 257/440 |
| 2007/0052051 A1 * | 3/2007 | Osaka et al. ............. | 257/440 |
| 2007/0108484 A1 * | 5/2007 | Nagamune et al. ............ | 257/290 |
| 2008/0102017 A1 | 5/2008 | Maruyama et al. | |
| 2008/0290941 A1 | 11/2008 | Ludwig | |
| 2009/0020764 A1 | 1/2009 | Anderson et al. | |
| 2009/0101914 A1 | 4/2009 | Hirotsu et al. | |
| 2009/0140801 A1 | 6/2009 | Ozyilmaz et al. | |
| 2009/0152664 A1 * | 6/2009 | Klem et al. ............ | 257/440 |
| 2009/0174435 A1 | 7/2009 | Stan et al. | |
| 2009/0181502 A1 | 7/2009 | Parikh et al. | |
| 2010/0157117 A1 * | 6/2010 | Wang ............ | 348/276 |
| 2011/0156114 A1 * | 6/2011 | Park et al. ............ | 257/294 |
| 2011/0212566 A1 * | 9/2011 | Portico Ambrosio et al. .. | 438/69 |
| 2011/0297815 A1 * | 12/2011 | Tian et al. ............ | 250/214 P |
| 2013/0099342 A1 * | 4/2013 | Fonash et al. ............ | 257/432 |

FOREIGN PATENT DOCUMENTS

| JP | 02-288688 | 11/1990 |
|---|---|---|
| JP | 2000-200899 | 7/2000 |

(Continued)

OTHER PUBLICATIONS

Cheong et al. "Photoresponsive conductance switching of multi-walled carbon nanotubes bearing covalently linked spironaphthoxazine." Nov. 2009, Current Applied Physics, vol. 9, Issue 6, pp. 1269-1271.*

*Primary Examiner* — Allan R Wilson

(74) *Attorney, Agent, or Firm* — Harness, Dickey & Pierce, P.L.C.

(57) ABSTRACT

Example embodiments are directed to a stack-type image sensor including resistance change elements. The stack-type image sensor includes at least two light-sensing layers that detect different color light stacked on different layers. The stack-type image sensor may not require a size of a unit pixel that detects a light color to be less than 1 μm in order to generate a high resolution color image. As such, resolution saturation may be avoided.

12 Claims, 3 Drawing Sheets

(56) References Cited

FOREIGN PATENT DOCUMENTS

| JP | 2005-318292 | 11/2005 |
| JP | 2006-270635 | 10/2006 |
| JP | 2007-067024 | 3/2007 |
| JP | 2008-105906 | 5/2008 |
| JP | 2008-205272 | 9/2008 |
| JP | 2009-043939 | 2/2009 |
| JP | 2009-141462 | 6/2009 |

\* cited by examiner

STACK-TYPE IMAGE SENSOR

CROSS-REFERENCE TO RELATED APPLICATION

This application claims the benefit under 35 U.S.C. §119 of Korean Patent Application No. 10-2010-0016668, filed on Feb. 24, 2010, in the Korean Intellectual Property Office, the disclosure of which is incorporated herein in its entirety by reference.

BACKGROUND

1. Field

Example embodiments relate to stack-type image sensors, and more particularly, to stack-type image sensors using a resistance change element.

2. Description of the Related Art

Image sensors are used in various fields. For example, high density image sensors may be used in a high definition camera, and image sensors sensitive to ultraviolet/infrared rays may be used in a touch panel. Most commercially available image sensors include a charge-coupled device (CCD) image sensor or a complementary metal oxide semiconductor (CMOS) image sensor. Each of the CCD image sensor and the CMOS image sensor uses a PN junction of a semiconductor material such as silicon.

Recently, research is being conducted in a micro process for highly integrate image sensors. If the size of a chip is reduced by using a micro process, while maintaining the same number of pixels of the image sensors, then more image sensors may be produced from one wafer. Accordingly, the unit cost of the image sensors may be reduced, production of the image sensors may be increased, the size of, for example, a camera module including the image sensors may be reduced, and a camera phone including the camera module may be relatively small and thin.

However, although the number of pixels is increased and the size of each of the pixels is reduced, if the size of a unit cell for detecting each color is less than 1 μm, that is, below the wavelength range of visible light, resolution is no longer increased due to an optical limitation caused by light diffraction. That is, resolution is not improved, although the size of each of the pixels is reduced to achieve a high degree of integration. This is referred to as resolution saturation. Accordingly, there is a demand for a method of increasing the number of pixels, without reducing the size of a unit cell to less than 1 μm, in order to improve resolution. Also, once the size of a unit cell is reduced, the area of a region for detecting light in a pixel, referred to as an aperture ratio, is also reduced, thereby lowering light use efficiency.

SUMMARY

According to example embodiments, an image sensor includes: at least two light-sensing layers stacked on different layers. Each of the at least two light-sensing layers includes at least one resistance change element. An electrical resistance of the at least one resistance change element may change according an amount of incident light.

According to example embodiments, the resistance change element may be carbon nanotubes on which spironaphthoxazine (SPO) is adsorbed.

According to example embodiments, the image sensor may further include a substrate; and a first light-sensing layer, a first filter layer, a second light-sensing layer, a second filter layer, and a third light-sensing layer sequentially stacked on the substrate.

According to example embodiments, the image sensor may further include at least one transparent insulating layer between the first light-sensing layer and the second light-sensing layer and between the second light-sensing layer and the third light-sensing layer.

According to example embodiments, the first filter layer may block light having a blue wavelength and transmit light having wavelengths other than the blue wavelength, and the second filter layer may block light having a green wavelength and transmit light having wavelengths other than the green wavelength or transmit light having a red wavelength and block light having wavelengths other than the red wavelength.

According to example embodiments, each of the first and second filter layers includes a light absorption adjusting layer including a light absorption material having an absorption coefficient that changes according to a wavelength of light incident on the light absorption adjusting layer and a thickness of the light absorption adjusting layer.

According to example embodiments, the light absorption adjusting layer of the first filter layer may be thinner than the light absorption adjusting layer of the second filter layer.

According to example embodiments, the first filter layer may be a blue complementary color filter that blocks light having a blue wavelength and transmits light having other wavelengths, and the second filter layer may be a green color complementary color filter that blocks light having a green wavelength and transmits light having other wavelengths or a red color filter that transmits light having a red wavelength.

According to example embodiments, each of the first through third light-sensing layers may include: the resistance change element and a capacitor connected to each other in parallel; a reset transistor having a source connected to one end of the resistance change element and the capacitor; a source follower transistor having a gate connected to the one end of the resistance change element and the capacitor and a drain connected to a drain of the reset transistor; a select transistor having a drain connected to a source of the source follower transistor; and an output line connected to a source of the select transistor.

According to example embodiments, each of the first through third light-sensing layers may further include a set transistor between the one end of the resistance change element and the capacitor, and the source of the reset transistor and the gate of the source follower transistor.

According to example embodiments, the image sensor is at least a portion of a pixel of a plurality of pixels, the plurality of pixels arranged in a two-dimensional array.

BRIEF DESCRIPTION OF THE DRAWINGS

The above and other features and advantages will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DETAILED DESCRIPTION

Figure 1:
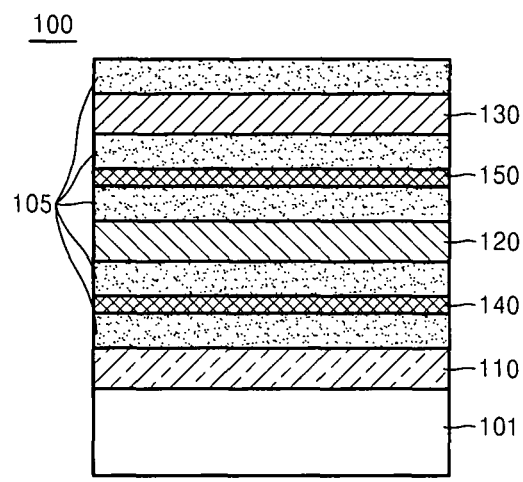
FIG. 1 is a cross-sectional view of a stack-type image sensor according to example embodiments.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

FIG. 1 is a cross-sectional view of a stack-type image sensor 100 using a resistance change element, according to example embodiments. Referring to FIG. 1, the image sensor 100 may include a plurality of, for example, first through third light-sensing layers 110, 120, and 130, stacked on different layers over a substrate 101 in one pixel. Although the first through third light-sensing layers 110, 120, and 130 are illustrated in FIG. 1, the number of light-sensing layers is not limited thereto and two or four or more light-sensing layers may be stacked according to a color detection method.

The image sensor 100 may include the first light-sensing layer 110, a first transparent insulating layer 105, a first filter layer 140, a second transparent insulating layer 105, the second light-sensing layer 120, a third transparent insulating layer 105, a second filter layer 150, a fourth transparent insulating layer 105, the third light-sensing layer 130, and a fifth transparent insulating layer 105 sequentially stacked on the substrate 101. That is, the first through fifth transparent insulating layers 105 may be disposed between and on the first through third light-sensing layers 110, 120, and 130, and the first and second filter layers 140 and 150 are respectively disposed between the first transparent insulating layer 105 and the second transparent insulating layer 105 and between the third transparent insulating layer 105 and the fourth transparent insulating layer 105. Each of the first through fifth transparent insulating layers 105 may be formed of a transparent insulating material such as $SiO_2$.

However, the first through fifth transparent insulating layers 105 disposed between and on the first through third light-sensing layers 110, 120, and 130 may be omitted if the first and second filter layers 140 and 150 have sufficient insulating characteristics.

Figure 2:
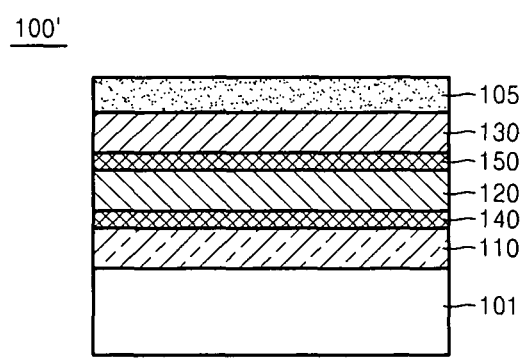
FIG. 2 is a cross-sectional view of a stack-type image sensor according to example embodiments.

FIG. 2 is a cross-sectional view of a stack-type image sensor 100', wherein the first through fourth transparent insulating layers 105 of FIG. 1 are omitted, according to example embodiments. Referring to FIG. 2, the image sensor 100' may include the first light-sensing layer 110, the first filter layer 140, the second light-sensing layer 120, the second filter layer 150, the third light-sensing layer 130, and the transparent insulating layer 105 sequentially stacked on the substrate 101. The transparent insulating layer 105, which is an uppermost layer, may protect the third light-sensing layer 130.

In order to enable the first through third light-sensing layers 110, 120, and 130 to detect light having different wavelengths, each of the first and second filter layers 140 and 150 may block light having a specific/desired wavelength. For example, the second filter layer 150 may block light having a blue wavelength and transmit light having wavelengths other than blue wavelength. The first filter layer 140 may block light having a green wavelength and transmit light having wavelengths other than green wavelength. Alternatively, the first filter layer 140 may transmit light having a red wavelength and block light having wavelengths other than red wavelength. Each of the first and second filter layers 140 and 150 may include a light absorption adjusting layer and/or a complementary color filter.

The light absorption adjusting layer includes a light absorption material having an absorption coefficient that varies according to a wavelength of light incident thereon and thickness of the layer. For example, amorphous silicon (a-Si) has an absorption coefficient for light having a blue wavelength that is about 1000 times greater than that for light having a red wavelength. Accordingly, if amorphous silicon having an appropriate thickness is selected, it is possible to selectively block light having a specific/desired wavelength. That is, if amorphous silicon is formed relatively thin, only light having a blue wavelength may be blocked and light having green and red wavelengths may be transmitted. If amorphous silicon is formed relatively thick, light having blue and green wavelengths may be blocked and light having a red wavelength may be transmitted. The light absorption material used to form the light absorption adjusting layer is not limited to amorphous silicon and may be any of crystalline silicon, Ge, GaAs, and $Ga_xIn_yS_2P$.

A complementary color filter refers to a filter that blocks light having a specific/desired wavelength and transmits light having wavelengths other than the specific/desired wavelength. For example, a blue complementary color filter blocks light having a blue wavelength and transmits light having wavelengths other than the blue wavelength. Since wavelength-based light transmitting/blocking characteristics of a complementary color filter are not affected by thickness, if a complementary color filter is used, the first and second filter layers 140 and 150 may have the same thickness. The complementary color filter may include an organic filter and/or inorganic filter. The inorganic filter may include, for example, $TiO_x$, $SiO_x$, $Fe_2O_3$, cobalt (Co)-doped $ZnO_x$, and/or Co-doped $Al_2O_3$.

As described above, the first filter layer 140 may be a red color filter that only transmits light having a red wavelength.

In FIGS. 1 and 2, light incident on the image sensor 100 or 100' may be detected by the first through third light-sensing layers 110, 120, and 130 based on color components. Accordingly, the first through third light-sensing layers 110, 120, and 130 may act as unit cells for detecting different color light. For example, the third light-sensing layer 130, which is an uppermost layer among the first through third light-sensing layers 110, 120, and 130, may detect red, green, and, blue light. Part of the light incident on the image sensor 100 or 100' travels toward the second light-sensing layer 120. The second filter layer 150 may block light having a blue wavelength and transmit light having wavelengths other than the blue wavelength. Accordingly, the second light-sensing layer 120 may detect mostly red and green light. Part of the light passing through the second light-sensing layer 120 travels toward the first light-sensing layer 110. The first filter layer 140 may block light having a green wavelength and transmit light having wavelengths other than green wavelength. Alternatively, the first filter layer 140 may transmit only light having a red wavelength and block light having wavelengths other than red wavelength. Accordingly, the first light-sensing layer 110 may detect mostly red light. Accordingly, intensities of red, green, and blue light may be exactly calculated by considering intensities of the light detected by the first through third light-sensing layers 110, 120, and 130 and a light loss after the light travels through the first through third light-sensing layers 110, 120, and 130.

Since each of the image sensors 100 and 100' has a structure in which the plurality of light-sensing layers 110, 120, and 130 are stacked, the size of a unit cell for detecting each color light may not be reduced to a size less than 1 μm, thereby avoiding resolution saturation. A conventional charge-coupled device (CCD) or complementary metal oxide semiconductor (CMOS) image sensor includes a plurality of light sensor cells arranged on one layer, wherein four photodiode cells arranged in a square shape form one pixel. For example, in one pixel, two photodiode cells in a diagonal direction include green cells, and two photodiode cells in another diagonal direction respectively include a red cell and a blue cell. That is, in the conventional CCD or CMOS image sensor, the size of a unit cell is ¼ or less of the size of a pixel. Accordingly, there is a limitation in increasing the degree of integration without resolution saturation. However, since the image sensors 100 and 100' illustrated in FIGS. 1 and 2 are constructed so that the size of a unit cell is equal to the size of a pixel, the degree of integration may be increased without resolution saturation.

In order for the first through third light-sensing layers 110, 120, and 130 to operate, light sensors in the first through third light-sensing layers 110, 120, and 130 may have electrical characteristics that vary according to an amount of incident light and transmitted light. The light sensors having such electrical characteristics may be obtained from a conventional semiconductor material. However, if conventional semiconductor materials having a PN junction structure are stacked, defects or poor PN junction may occur during a manufacturing process. Due to the defects or poor PN junction, the amount of dark current may be increased and image blur may occur. Wafer bonding may be used to correct the defects or poor PN junction. However, in this case, throughput may be reduced due to misalignment caused during the wafer bonding.

Accordingly, the image sensors 100 and 100' of FIGS. 1 and 2 use resistance change elements having an electrical resistance that changes according to the amount of incident light as the light sensors in the first through third light-sensing layers 110, 120, and 130. For example, carbon nanotubes (CNTs) on which spironaphthoxazine (SPO) is adsorbed may be used as the light sensors of the first through third light-sensing layers 110, 120, and 130. In this case, when the SPO is exposed to light, electrons change from a lowest unoccupied molecular orbital (LUMO) to a highest occupied molecular orbital (HOMO), and thus the resistance state of the CNTs changed from a high resistance state to a low resistance state. Accordingly, the intensity of incident light may be measured by using a change in the resistance of the CNTs on which the SPO is adsorbed.

Figure 3:
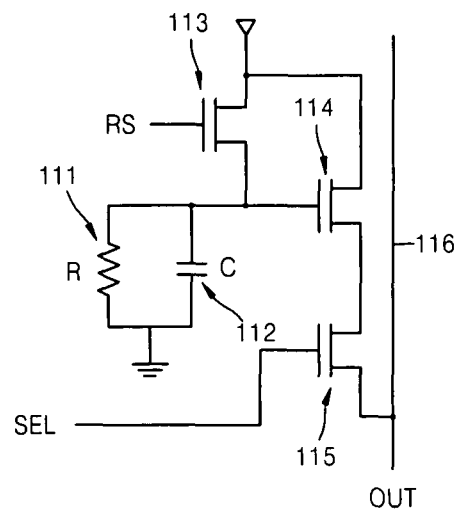
FIG. 3 is a circuit diagram illustrating a light-sensing layer in the stack-type image sensor of FIG. 1 or 2, according to example embodiments.

FIG. 3 is a circuit diagram illustrating one of the first through third light-sensing layers 110, 120, and 130 in the stack-type image sensor 100 or 100' of FIG. 1 or 2, according to example embodiments. Referring to FIG. 3, a resistance change element 111 and a capacitor 112 are connected to each other in parallel. In order to output a change in the resistance of the resistance change element 111, a driving circuit including three transistors is connected to the resistance change element 111 and the capacitor 112. In detail, a source of a reset (RS) transistor 113 and a gate of a source follower transistor 114 are connected to one end of the resistance change element 111 and the capacitor 112. A driving voltage is applied to drains of the RS transistor 113 and the source follower transistor 114. A source of the source follower transistor 114 and a drain of a select (SEL) transistor 115 are connected to each other, and a source of the SEL transistor 115 is connected to an output line 116. Other ends of the resistance change element 111 and the capacitor 112 are grounded.

In this configuration, the SEL transistor 115 is turned on by applying a gate voltage to a gate of the SEL transistor 115. Next, the RS transistor 113 is turned on by applying a gate voltage to a gate of the RS transistor 113. Accordingly, a driving voltage is applied to the capacitor 112 to charge the capacitor 112. Accordingly, the resistance change element 111 and the capacitor 112 are reset to a reference voltage. Since the reference voltage is applied to the gate of the source follower transistor 114, current is supplied from the drain of the source follower transistor 114 through the SEL transistor 115 to the output line 116. In this state, if light is incident on the light sensing layer including the resistance change element 111, the resistance change element 111 is changed to a low resistance state. Accordingly, electric charges stored in the capacitor 112 are discharged, and thus a voltage applied to the gate of the source follower transistor 114 is lowered. As a result, the amount of current flowing from the source follower transistor 114 through the SEL transistor 115 to the output line 116 is reduced. The amount of the light incident on the resistance change element 111 may be obtained from a change in the amount of current.

Although the driving circuit illustrated in FIG. 3 includes three transistors, the RS transistor 113, the source follower transistor 114, and the SEL transistor 115, example embodiments are not limited thereto. The driving circuit may be configured in a variety of different ways according to design requirements. For example, the driving circuit may include only one transistor. However, in order to reduce noise and obtain more accurate data, the driving circuit may include four or more transistors.

Figure 4:
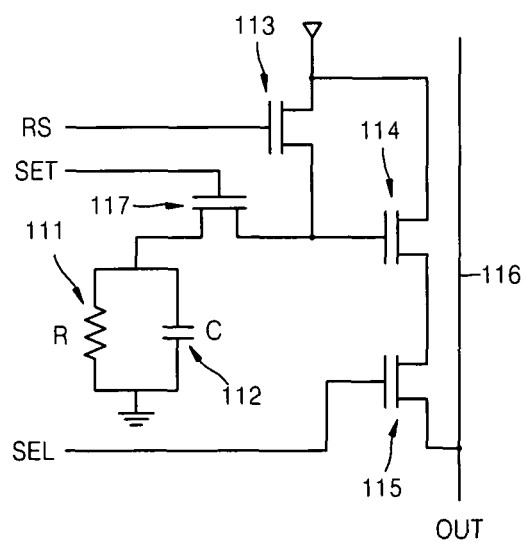
FIG. 4 is a circuit diagram illustrating a light-sensing layer in the stack-type image sensor of FIG. 1 or 2, according to example embodiments.

FIG. 4 is a circuit diagram illustrating one of the first through third light-sensing layers 110, 120, and 130 including a driving circuit including four transistors, in the stack-type image sensor 100 or 100' of FIG. 1 or 2, according to example embodiments. The driving circuit of FIG. 4 is different from the driving circuit of FIG. 3 in that a set (SET) transistor 117 is further disposed between one end of the resistance change element 111 and the capacitor 112 and the source of the RS transistor 113 and the gate of the source follower transistor 114. Although not shown, an amplifier shared by a plurality of pixels may be further added to the driving circuit.

The driving circuit illustrated in FIGS. 3 and/or 4 may be included in each of the first through third light-sensing layers 110, 120, and 130 illustrated in FIG. 1. For example, the first light-sensing layer 110 may include the resistance change element 111, the capacitor 112, the RS transistor 113, the source follower transistor 114, the SEL transistor 115, and/or the output line 116 illustrated in FIG. 3. Likewise, each of the second light-sensing layer 120 and the third light-sensing layer 130 may include the resistance change element 111, the capacitor 112, the RS transistor 113, the source follower transistor 114, the SEL transistor 115, and/or the output line 116. Accordingly, the color and intensity of incident light may be calculated by using outputs obtained from the output lines 116 of the first through third light-sensing layers 110, 120, and 130.

Figure 5:
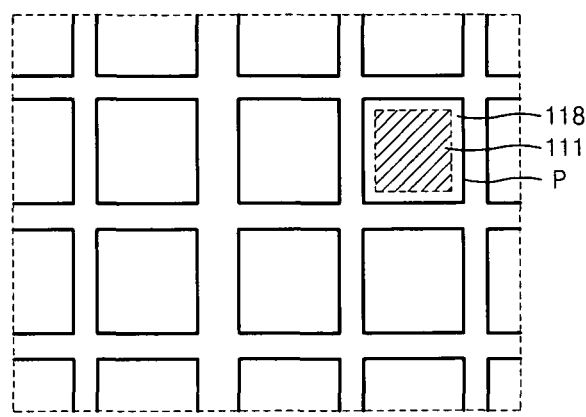
FIG. 5 illustrates pixels in the stack-type image sensor of FIG. 1 or 2, according to example embodiments.

In order to obtain a two-dimensional (2D) image, the image sensor 100, 100' of FIG. 1 or 2 may be arranged in a form of a plurality of pixels P of a two dimensional array, as shown in FIG. 5. FIG. 5 illustrates pixels P including at least a portion of the stack-type image sensor 100 or 100' as shown in the example embodiments of FIG. 1 or 2. Each of the plurality of pixels P may have a cross-sectional view as shown in the example embodiments of FIG. 1 or 2. The driving circuit illustrated in the example embodiments of FIG. 3 or 4 is included in each of the first through third light-sensing layers 110, 120, and 130 in each of the plurality of pixels P. Referring to FIG. 5, at least a portion each pixel P (in instances, a majority portion of each pixel P) is occupied by the resistance change element 111, marked by hatched region enclosed by the dashed line. A remaining portion 118 of the pixel P not occupied by the resistance change element 111 may be occupied by either one or all of the capacitor 112, the RS transistor 113, the source follower transistor 114, the SEL transistor 115, the output line 116 and SET transistor 117. Accordingly, an area of a region that detects light in each pixel, referred to as an aspect ratio, may be sufficiently large, sensitivity may therefore be improved.

The image sensors according to example embodiments may be used in, for example, a light-sensitive touch panel, a digital camera, a camcorder, a mobile phone, a portable electronic device or the like.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. An image sensor comprising:
    at least two light-sensing layers stacked on different layers, each of the at least two light-sensing layers including at least one resistance change element, an electrical resistance of the at least one resistance change element changing according to an amount of incident light; and
    at least one filter layer, the at least one filter layer including a light absorption adjusting layer, wherein
        the at least two light-sensing layers and the at least one filter layer are alternately disposed in a vertical direction, and
        the light absorption adjusting layer includes a light absorption material having an absorption coefficient that varies according to a wavelength of light incident on the light absorption adjusting layer and a thickness of the light absorption adjusting layer.

2. The image sensor of claim 1, wherein the resistance change element is carbon nanotubes on which spironaphthoxazine (SPO) is adsorbed.

3. The image sensor of claim 1, further comprising:
    a substrate; wherein
        the at least one filter layer includes a first filter layer and a second filter layer,
        the at least two light-sensing layers include a first light-sensing layer, a second light-sensing layer and a third light-sensing layer, and
        the first light-sensing layer, the first filter layer, the second light-sensing layer, the second filter layer, and the third light-sensing layer are sequentially stacked on the substrate.

4. The image sensor of claim 3, wherein the first filter layer blocks light having a blue wavelength and transmits light having wavelengths other than the blue wavelength, and the second filter layer blocks light having a green wavelength and transmits light having wavelengths other than the green wavelength or transmits light having a red wavelength and blocks light having wavelengths other than the red wavelength.

5. The image sensor of claim 4, wherein the light absorption adjusting layer of the first filter layer is thinner than the light absorption adjusting layer of the second filter layer.

6. The image sensor of claim 4, wherein the first filter layer is a blue complementary color filter that blocks light having a blue wavelength and transmits light having other wavelengths, and the second filter layer is a green color complementary color filter that blocks light having a green wavelength and transmits light having other wavelengths or a red color filter that transmits light having a red wavelength.

7. A two-dimensional pixel array comprising:
    a plurality of pixels, at least one pixel of the plurality of pixels including the image sensor of claim 1.

8. An image sensor comprising:
    at least two light-sensing layers stacked on different layers, each of the at least two light-sensing layers including at least one resistance change element, an electrical resistance of the at least one resistance change element changing according to an amount of incident light;
    a substrate;
    a first filter layer;
    a second filter layer, each of the first and second filter layers including a light absorption adjusting layer, wherein
        the light absorption adjusting layer includes a light absorption material having an absorption coefficient that varies according to a wavelength of light incident on the light absorption adjusting layer and a thickness of the light absorption adjusting layer, the at least two light-sensing layers include a first light-sensing layer, a second light-sensing layer and a third light-sensing layer, and the first light-sensing layer, the first filter layer, the second light-sensing layer, the second filter layer, and the third light-sensing layer are sequentially stacked on the substrate; and at least one transparent insulating layer between the first light-sensing layer and the second light-sensing layer and between the second light-sensing layer and the third light-sensing layer.

9. A two-dimensional pixel array comprising:
a plurality of pixels, at least one pixel of the plurality of pixels including the image sensor of claim 8.

10. An image sensor comprising:
at least two light-sensing layers stacked on different layers, each of the at least two light-sensing layers including at least one resistance change element, an electrical resistance of the at least one resistance change element changing according to an amount of incident light;

at least one filter layer, the at least one filter layer including a light absorption adjusting layer, the at least two light-sensing layers and the at least one filter layer being alternately disposed in a vertical direction; and a substrate, wherein,
the at least one filter layer includes a first filter layer and a second filter layer, the at least two light-sensing layers include a first light-sensing layer, a second light-sensing layer and a third light-sensing layer, the first light-sensing layer, the first filter layer, the second light-sensing layer, the second filter layer, and the third light-sensing layer are sequentially stacked on the substrate, and each of the first through third light-sensing layers includes, the resistance change element and a capacitor connected to each other in parallel, a reset transistor having a source connected to one end of the resistance change element and the capacitor, a source follower transistor having a gate connected to the one end of the resistance change element and the capacitor and a drain connected to a drain of the reset transistor, a select transistor having a drain connected to a source of the source follower transistor, and an output line connected to a source of the select transistor.

11. The image sensor of claim 10, wherein each of the first through third light-sensing layers further comprises:
a set transistor between the one end of the resistance change element and the capacitor, and the source of the reset transistor and the gate of the source follower transistor.

12. An image sensor comprising:
at least two light-sensing layers stacked on different layers, each of the at least two light-sensing layers including at least one resistance change element, a current flowing in each of the two light-sensing layers being changed according to an amount of incident light; and at least one filter layer, the at least one filter layer including a light absorption adjusting layer, wherein
the at least two light-sensing layers and the at least one filter layer are alternately disposed in a vertical direction, and the light absorption adjusting layer including a light absorption material having an absorption coefficient that varies according to a wavelength of light incident on the light absorption adjusting layer and a thickness of the light absorption adjusting layer.

* * * * *